United States Patent
Gotterba et al.

(10) Patent No.: US 10,009,027 B2
(45) Date of Patent: Jun. 26, 2018

(54) THREE STATE LATCH

(71) Applicant: Nvidia Corporation, Santa Clara, CA (US)

(72) Inventors: Andreas J. Gotterba, Santa Clara, CA (US); Jesse S. Wang, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days. days.

(21) Appl. No.: 15/476,847

(22) Filed: Mar. 31, 2017

(65) Prior Publication Data
US 2017/0207783 A1    Jul. 20, 2017

Related U.S. Application Data

(62) Division of application No. 13/909,981, filed on Jun. 4, 2013.

(51) Int. Cl.
| | | |
|---|---|---|
| *H03K 19/00* | (2006.01) | |
| *H03K 3/038* | (2006.01) | |
| *H03K 19/094* | (2006.01) | |
| *G11C 11/419* | (2006.01) | |
| *G11C 7/06* | (2006.01) | |

(52) U.S. Cl.
CPC ......... *H03K 19/0002* (2013.01); *G11C 7/065* (2013.01); *G11C 11/419* (2013.01); *H03K 3/038* (2013.01); *H03K 19/09425* (2013.01)

(58) Field of Classification Search
None
See application file for complete search history.

(56) References Cited

U.S. PATENT DOCUMENTS

| | | |
|---|---|---|
| 3,178,590 A | 4/1965 | Heilweil et al. |
| 3,241,122 A | 3/1966 | Bardell |
| 3,252,001 A | 5/1966 | Thompson et al. |
| 3,252,004 A | 5/1966 | Scherr |
| 3,381,232 A | 4/1968 | Hoernes et al. |
| 3,413,557 A | 11/1968 | Muhlenbruch et al. |
| 3,421,026 A | 1/1969 | Stopper |
| 3,444,470 A | 5/1969 | Bolt et al. |
| 3,444,480 A | 5/1969 | Tykulsky et al. |

(Continued)

FOREIGN PATENT DOCUMENTS

JP    2004214997    7/2004

OTHER PUBLICATIONS

Bowman. et al., "Time-Borrowing Multi-Cycle On-Chip Interconnects for Delay Vanation Tolerance", Circuit Research Lab, Intel Corporation, Hillsboro, OR, Copyright 2006, ISLPED Oct. 4-6, 2006, pp. 79-84.

(Continued)

*Primary Examiner* — Crystal L Hammond

(57) ABSTRACT

Three state latch. In accordance with a first embodiment, an electronic circuit includes n pairs of cascaded logical gates. Each of the n pairs of cascaded logical gates includes a first logical gate including n−1 first gate inputs and one first gate output, and a second logical gate including two second gate inputs and one second gate output. One of the second gate inputs is coupled to the first gate output. The second gate output is cross coupled to one of the first gate inputs of all other the pairs of cascaded logical gates, and n is greater than 2.

22 Claims, 3 Drawing Sheets

(56) References Cited

U.S. PATENT DOCUMENTS

| | | | |
|---|---|---|---|
| 3,474,262 A | 10/1969 | Turcotte | |
| 3,539,938 A * | 11/1970 | Heimbigner | H03K 5/1504 327/293 |
| 3,757,231 A * | 9/1973 | Faustini | G06F 5/06 377/66 |
| 3,760,167 A * | 9/1973 | Schrimshaw | H04L 27/00 333/18 |
| 3,760,170 A * | 9/1973 | Weber, Jr. | G05B 19/184 318/570 |
| 4,107,549 A * | 8/1978 | Moufah | H03K 3/3568 326/59 |
| 4,256,411 A | 3/1981 | Podosek | |
| 4,399,377 A * | 8/1983 | Jones | H03K 3/037 326/37 |
| 4,544,851 A * | 10/1985 | Conrad | G06F 1/12 327/141 |
| 4,587,480 A * | 5/1986 | Zasio | G11C 5/063 324/310 |
| 4,680,484 A * | 7/1987 | Saunders | H03K 19/01721 326/114 |
| 5,032,708 A | 7/1991 | Comerford et al. | |
| 5,121,003 A * | 6/1992 | Williams | G06F 7/535 326/121 |
| 5,124,084 A | 6/1992 | Eide | |
| 5,124,804 A | 6/1992 | Socarras | |
| 5,140,174 A * | 8/1992 | Meier | H03K 5/151 327/171 |
| 5,262,973 A | 11/1993 | Richardson | |
| 5,305,258 A | 4/1994 | Koshizuka | |
| 5,349,255 A | 9/1994 | Patel | |
| 5,422,805 A | 6/1995 | McIntyre et al. | |
| 5,448,257 A | 9/1995 | Margeson, III et al. | |
| 5,586,069 A | 12/1996 | Dockser | |
| 5,586,081 A | 12/1996 | Mills et al. | |
| 5,592,126 A * | 1/1997 | Boudewijns | H03K 3/0315 331/172 |
| 5,600,598 A | 2/1997 | Skjaveland et al. | |
| 5,604,689 A | 2/1997 | Dockser | |
| 5,615,113 A | 3/1997 | Matula | |
| 5,638,312 A | 6/1997 | Simone | |
| 5,646,675 A | 7/1997 | Copriviza et al. | |
| 5,694,355 A | 12/1997 | Skjaveland et al. | |
| 5,696,990 A | 12/1997 | Rosenthal et al. | |
| 5,748,515 A | 5/1998 | Glass et al. | |
| 5,821,791 A | 10/1998 | Gaibotti et al. | |
| 5,835,941 A | 11/1998 | Pawlowski | |
| 5,867,443 A | 2/1999 | Linderman | |
| 5,870,329 A | 2/1999 | Foss | |
| 5,903,171 A | 5/1999 | Shieh | |
| 5,949,706 A | 9/1999 | Chang et al. | |
| 6,005,430 A * | 12/1999 | Brown | G06F 1/10 327/277 |
| 6,009,451 A | 12/1999 | Burns | |
| 6,031,388 A * | 2/2000 | Dobbelaere | H03K 19/01721 326/17 |
| 6,041,008 A | 3/2000 | Marr | |
| 6,055,590 A | 4/2000 | Pettey et al. | |
| 6,084,856 A | 7/2000 | Simmons et al. | |
| 6,118,304 A | 9/2000 | Potter et al. | |
| 6,125,064 A | 9/2000 | Kim et al. | |
| 6,133,754 A | 10/2000 | Olson | |
| 6,163,500 A | 12/2000 | Wilford et al. | |
| 6,173,303 B1 | 1/2001 | Avigdor et al. | |
| 6,173,306 B1 | 1/2001 | Raz et al. | |
| 6,263,331 B1 | 7/2001 | Liu et al. | |
| 6,263,410 B1 | 7/2001 | Kao et al. | |
| 6,265,894 B1 | 7/2001 | Reblewski et al. | |
| 6,265,922 B1 | 7/2001 | Kirsch | |
| 6,300,809 B1 | 10/2001 | Gregor et al. | |
| 6,304,505 B1 | 10/2001 | Forbes et al. | |
| 6,310,501 B1 | 10/2001 | Yamashita | |
| 6,366,529 B1 | 4/2002 | Williams et al. | |
| 6,396,309 B1 | 5/2002 | Zhao et al. | |
| 6,400,735 B1 | 7/2002 | Percey | |
| 6,438,024 B1 | 8/2002 | Gold et al. | |
| 6,442,721 B2 | 8/2002 | Whetsel | |
| 6,452,433 B1 | 9/2002 | Chang et al. | |
| 6,472,920 B1 | 10/2002 | Cho et al. | |
| 6,501,644 B1 | 12/2002 | Silverman et al. | |
| 6,501,677 B1 | 12/2002 | Rau et al. | |
| 6,580,411 B1 | 6/2003 | Kubota et al. | |
| 6,630,853 B1 | 10/2003 | Hamada | |
| 6,646,938 B2 | 11/2003 | Kodama | |
| 6,714,060 B2 | 3/2004 | Araki | |
| 6,747,485 B2 | 6/2004 | Suryanarayana et al. | |
| 6,771,104 B2 | 8/2004 | Hars | |
| 6,803,610 B2 | 10/2004 | Koolhaas et al. | |
| 6,842,059 B1 | 1/2005 | Wu | |
| 6,885,589 B2 | 4/2005 | Cioaca | |
| 6,924,683 B1 | 8/2005 | Hayter | |
| 6,987,775 B1 | 1/2006 | Haywood | |
| 7,026,975 B1 * | 4/2006 | Steward | H03M 1/462 341/155 |
| 7,051,169 B2 | 5/2006 | Ganton | |
| 7,057,421 B2 | 6/2006 | Shi et al. | |
| 7,106,098 B1 | 9/2006 | Zack et al. | |
| 7,111,133 B2 | 9/2006 | Ishikawa et al. | |
| 7,196,552 B2 | 3/2007 | Zhou | |
| 7,227,798 B2 | 6/2007 | Gupta et al. | |
| 7,242,235 B1 | 7/2007 | Nguyen | |
| 7,283,404 B2 | 10/2007 | Khan et al. | |
| 7,304,903 B2 | 12/2007 | Mukhopadhyay et al. | |
| 7,333,516 B1 | 2/2008 | Sikkink et al. | |
| 7,346,861 B1 | 3/2008 | Lee | |
| 7,405,606 B2 | 7/2008 | Kok et al. | |
| 7,408,393 B1 | 8/2008 | Jain et al. | |
| 7,411,233 B2 | 8/2008 | Chao et al. | |
| 7,414,903 B2 | 8/2008 | Noda | |
| 7,418,641 B2 | 8/2008 | Drake et al. | |
| 7,441,233 B1 | 10/2008 | Orndorff et al. | |
| 7,477,112 B1 * | 1/2009 | Pi | H03K 3/0315 327/296 |
| 7,498,850 B2 | 3/2009 | Hendrickson | |
| 7,499,347 B2 | 3/2009 | Chen et al. | |
| 7,603,246 B2 | 10/2009 | Newcomb et al. | |
| 7,613,030 B2 | 11/2009 | Iwata et al. | |
| 7,630,389 B1 | 12/2009 | Alfieri et al. | |
| 7,724,606 B2 | 5/2010 | Osawa et al. | |
| 7,739,538 B2 | 6/2010 | Fee et al. | |
| 7,747,917 B2 | 6/2010 | Putman et al. | |
| 7,760,117 B1 | 7/2010 | Chou | |
| 7,783,911 B2 | 8/2010 | Chen et al. | |
| 8,164,934 B2 | 4/2012 | Watanabe et al. | |
| 8,330,517 B1 | 12/2012 | Cline | |
| 8,330,571 B2 | 12/2012 | Yamaguchi et al. | |
| 8,332,957 B2 | 12/2012 | Hayasaka | |
| 8,352,530 B2 | 1/2013 | Dao et al. | |
| 8,363,492 B2 | 1/2013 | Ishino et al. | |
| 8,369,177 B2 | 2/2013 | Hold et al. | |
| 8,453,096 B2 | 5/2013 | Magee et al. | |
| 8,488,360 B2 | 7/2013 | Okuda | |
| 8,497,690 B2 | 7/2013 | Bartling et al. | |
| 8,565,034 B1 | 10/2013 | Lu et al. | |
| 8,570,818 B2 | 10/2013 | Jung et al. | |
| 8,662,957 B2 | 3/2014 | Paik et al. | |
| 8,742,796 B2 | 6/2014 | Dally et al. | |
| 8,760,208 B2 | 6/2014 | Dike et al. | |
| 8,830,766 B2 | 9/2014 | Sahu | |
| 8,848,458 B2 | 9/2014 | Kottapalli et al. | |
| 8,908,449 B1 | 12/2014 | Ramaraju | |
| 8,964,457 B2 | 2/2015 | Liaw | |
| 8,981,822 B2 * | 3/2015 | Li | H03K 23/68 327/115 |
| 9,342,181 B2 | 5/2016 | Wyatt et al. | |
| 2001/0018734 A1 | 8/2001 | Lie | |
| 2002/0036656 A1 | 3/2002 | Francis et al. | |
| 2002/0058118 A1 | 5/2002 | Kiyooka et al. | |
| 2002/0085118 A1 | 7/2002 | Harris et al. | |
| 2002/0089364 A1 | 7/2002 | Goldgeisser et al. | |
| 2003/0025217 A1 | 2/2003 | Song | |
| 2003/0075289 A1 | 4/2003 | Stoltz | |
| 2003/0076289 A1 | 4/2003 | Tokonami et al. | |
| 2003/0117170 A1 | 6/2003 | Meneghini | |

(56) References Cited

U.S. PATENT DOCUMENTS

| | | |
|---|---|---|
| 2003/0120886 A1 | 6/2003 | Moller et al. |
| 2003/0123320 A1 | 7/2003 | Wright et al. |
| 2003/0156461 A1 | 8/2003 | Demone |
| 2003/0210078 A1 | 11/2003 | Wijetunga et al. |
| 2004/0027184 A1 | 2/2004 | Araki |
| 2004/0027187 A1 | 2/2004 | Takahashi et al. |
| 2004/0041769 A1 | 3/2004 | Yamashita et al. |
| 2004/0160244 A1 | 8/2004 | Kim |
| 2004/0243896 A1 | 12/2004 | Jaber et al. |
| 2005/0040856 A1 | 2/2005 | Ramaraju et al. |
| 2005/0108604 A1 | 5/2005 | Wong |
| 2005/0128844 A1 | 6/2005 | Yamagami |
| 2005/0171879 A1 | 8/2005 | Lin |
| 2005/0216806 A1 | 9/2005 | Verwegen |
| 2006/0038593 A1* | 2/2006 | Abe ............ H03K 5/082 327/112 |
| 2006/0049852 A1 | 3/2006 | Park et al. |
| 2006/0095819 A1 | 5/2006 | Bhatia |
| 2006/0103478 A1* | 5/2006 | Brown ............ H03K 3/0315 331/57 |
| 2006/0132209 A1 | 6/2006 | Meltzer et al. |
| 2006/0136656 A1 | 6/2006 | Conley et al. |
| 2007/0028157 A1 | 2/2007 | Drake et al. |
| 2007/0130212 A1 | 6/2007 | Peurach et al. |
| 2007/0130242 A1 | 6/2007 | Tajiri |
| 2007/0146033 A1 | 6/2007 | Pesci |
| 2007/0180006 A1 | 8/2007 | Gyoten et al. |
| 2007/0253263 A1 | 11/2007 | Noda |
| 2007/0255987 A1 | 11/2007 | Abhishek |
| 2007/0300095 A1 | 12/2007 | Fee et al. |
| 2007/0300108 A1 | 12/2007 | Saint-Laurent et al. |
| 2008/0036743 A1 | 2/2008 | Westerman et al. |
| 2008/0082930 A1 | 4/2008 | Omernick et al. |
| 2008/0086667 A1 | 4/2008 | Chen et al. |
| 2008/0100597 A1 | 5/2008 | Quan |
| 2008/0115025 A1 | 5/2008 | Frederick |
| 2008/0162997 A1 | 7/2008 | Vu et al. |
| 2008/0165141 A1 | 7/2008 | Christie |
| 2008/0195334 A1 | 8/2008 | Rigler et al. |
| 2008/0195337 A1 | 8/2008 | Agarwal et al. |
| 2008/0209114 A1 | 8/2008 | Chow et al. |
| 2008/0209774 A1 | 9/2008 | Robin |
| 2008/0270862 A1 | 10/2008 | Drake et al. |
| 2009/0040848 A1 | 2/2009 | Nitta |
| 2009/0119631 A1 | 5/2009 | Cortadella et al. |
| 2009/0164951 A1 | 6/2009 | Kumar |
| 2009/0168499 A1 | 7/2009 | Kushida et al. |
| 2009/0224776 A1 | 9/2009 | Keith |
| 2009/0273556 A1 | 11/2009 | Shimoshikiryoh et al. |
| 2010/0059295 A1 | 3/2010 | Hotelling et al. |
| 2010/0097343 A1 | 4/2010 | Fang |
| 2010/0102890 A1 | 4/2010 | Stratz et al. |
| 2010/0109707 A1 | 5/2010 | Srivastava et al. |
| 2010/0134437 A1 | 6/2010 | Yang et al. |
| 2010/0174877 A1 | 7/2010 | Yagihashi |
| 2010/0176327 A1 | 7/2010 | Hoang |
| 2010/0235732 A1 | 9/2010 | Bergman |
| 2010/0238130 A1 | 9/2010 | Lin et al. |
| 2010/0253639 A1 | 10/2010 | Huang et al. |
| 2010/0306426 A1 | 12/2010 | Boonstra et al. |
| 2010/0332924 A1 | 12/2010 | Ziaja et al. |
| 2011/0040906 A1 | 2/2011 | Chung et al. |
| 2011/0066904 A1 | 3/2011 | Lackey |
| 2011/0122088 A1 | 5/2011 | Lin et al. |
| 2011/0127340 A1 | 6/2011 | Aiken |
| 2011/0168875 A1 | 7/2011 | Okuda |
| 2011/0181519 A1 | 7/2011 | Tsai et al. |
| 2012/0019467 A1 | 1/2012 | Hotelling et al. |
| 2012/0030623 A1 | 2/2012 | Hoellwarth |
| 2012/0050206 A1 | 3/2012 | Welland |
| 2012/0054379 A1 | 3/2012 | Leung et al. |
| 2012/0075188 A1 | 3/2012 | Kwa et al. |
| 2012/0147680 A1 | 6/2012 | Koike |
| 2012/0155781 A1 | 6/2012 | Onoue |
| 2012/0163068 A1 | 6/2012 | Houston |
| 2012/0175646 A1 | 7/2012 | Huang et al. |
| 2012/0176327 A1 | 7/2012 | Na et al. |
| 2012/0176546 A1 | 7/2012 | Yoon |
| 2012/0182056 A1 | 7/2012 | Dally et al. |
| 2012/0229419 A1 | 9/2012 | Schwartz et al. |
| 2012/0229719 A1 | 9/2012 | Ishiguro |
| 2012/0249204 A1 | 10/2012 | Nishioka et al. |
| 2012/0262463 A1 | 10/2012 | Bakalash et al. |
| 2012/0268414 A1 | 10/2012 | Alameh et al. |
| 2012/0268416 A1 | 10/2012 | Pirogov et al. |
| 2013/0038587 A1 | 2/2013 | Song et al. |
| 2013/0067894 A1 | 3/2013 | Stewart et al. |
| 2013/0069867 A1 | 3/2013 | Watanabe |
| 2013/0069894 A1 | 3/2013 | Chen et al. |
| 2013/0069897 A1 | 3/2013 | Liu et al. |
| 2013/0080491 A1 | 3/2013 | Pitkethly |
| 2013/0080740 A1 | 3/2013 | Gentle et al. |
| 2013/0129083 A1 | 5/2013 | Fujino |
| 2013/0154691 A1* | 6/2013 | Li ............ G06F 1/06 327/117 |
| 2013/0155781 A1 | 6/2013 | Kottapalli et al. |
| 2013/0155783 A1 | 6/2013 | Kottapalli et al. |
| 2013/0176251 A1 | 7/2013 | Wyatt et al. |
| 2014/0003160 A1 | 1/2014 | Trivedi et al. |
| 2014/0056050 A1 | 2/2014 | Yang et al. |
| 2014/0129745 A1 | 5/2014 | Alfieri |
| 2014/0156891 A1 | 6/2014 | Alfieri |
| 2014/0184268 A1 | 7/2014 | Alfieri et al. |
| 2014/0244921 A1 | 8/2014 | Alfieri et al. |
| 2014/0340387 A1 | 11/2014 | Song et al. |
| 2014/0354330 A1 | 12/2014 | Gotterba et al. |
| 2014/0355334 A1 | 12/2014 | Gotterba et al. |
| 2014/0355362 A1 | 12/2014 | Wang et al. |
| 2015/0016183 A1 | 1/2015 | Sinangil et al. |
| 2016/0069894 A1 | 3/2016 | Smider et al. |
| 2016/0269002 A1 | 9/2016 | Zhang et al. |

OTHER PUBLICATIONS

Weste, Neil H.E., and David Money Harris. CMOS VLSI Design: A Circuits and Systems Perspective. 2011. Addison-Wesley. 4th Ediition. Chapter 1, pp. 1-61.

* cited by examiner

THREE STATE LATCH

RELATED APPLICATIONS

This application is a Divisional Application of co-pending, commonly owned U.S. patent application Ser. No. 13/909,981, filed Jun. 4, 2013, entitled "Three State Latch," to Gotterba and Wang, which is hereby incorporated herein by reference in its entirety.

U.S. patent application Ser. No. 13/909,981 is related to co-pending, commonly owned U.S. patent application Ser. No. 13/910,001, filed Jun. 4, 2013, entitled "Handshaking Sense Amplifier," to Gotterba and Wang, and to U.S. patent application Ser. No. 13/910,038, filed Jun. 4, 2013, entitled "Pipelined One Cycle Throughput for Single-Port 6T RAM," to Wang and Gotterba. Both applications are hereby incorporated herein by reference in their entireties for all purposes.

FIELD OF INVENTION

Embodiments of the present invention relate to the field of integrated circuit design and operation. More specifically, embodiments of the present invention relate to systems and methods for three state latches.

BACKGROUND

The term "latch" conventionally is used to refer to or to describe an electronic circuit that has two stable states and may be used to store a value, e.g., a single bit of information. Latches may be used for a wide variety of circuit applications, including, for example, in finite state machines, as counters and for synchronizing signals. If more than two states, e.g., more than one bit of information, are required, it is common to combine two or more latches to represent the desired number of states.

Unfortunately, such multiple-latch circuits suffer from several deleterious drawbacks. For example, a multiple-latch circuit generally requires additional circuitry surrounding the latches to "interpret" the combined state of the latches, and to control the state changes of the multiple latches. Such additional circuitry may slow down the operation of the multiple-latch circuit. In addition, a multiple-latch circuit is less deterministic than a single latch. For example, while any single latch may be in a known state, a multiple-latch circuit may be in a variety of transitory states. For example, one latch of a multiple-latch circuit may operate faster than another, completing a state transition prior to another latch changing state. Additionally, the state of one latch may depend on the state of another latch, and thus cannot change until the other latch has completed its transition. Further, the state-control logic surrounding the multiple latches requires a finite time to command, control and/or report a combined state of the multiple latches, further introducing times at which a state of a multiple-latch circuit is indeterminate.

SUMMARY OF THE INVENTION

Therefore, what is needed are systems and methods for three state latches. What is additionally needed are systems and methods for three state latches that store more than two states in a single latch circuit. A further need is for systems and methods for three state latches that store more than two states in a single latch circuit in a deterministic manner. A still further need exists for systems and methods for three state latches that are compatible and complementary with existing systems and methods of integrated circuit design, manufacturing and test. Embodiments of the present invention provide these advantages.

In accordance with a first embodiment of the present invention, an electronic circuit includes a single latch having three stable states. The electronic circuit may be configured so that all three outputs reflect a change at any one input in not more than three gate delays. The electronic circuit may further be configured so that when all inputs are set to one, a previous state of the latch is retained and output on the outputs.

In accordance with another embodiment of the present invention, an electronic circuit includes n pairs of cascaded logical gates, wherein each of the n pairs of cascaded logical gates includes a first logical gate comprising n−1 first gate inputs and one first gate output, and a second logical gate comprising two second gate inputs and one second gate output. One of the second gate inputs is coupled to the first gate output. The second gate output is cross coupled to one of the first gate inputs of all other pairs of cascaded gates. The value of n is greater than two. The pairs of cascaded gates may be rendered as a single OR-AND-Invert (OAI) gate.

In accordance with a further embodiment of the present invention, an electronic circuit includes a single latch circuit. The single latch circuit includes a first OR-AND-Invert gate having an output coupled to an OR input of a second OAI gate and to an OR input of a third OAI gate. The second OR-AND-Invert gate has an output coupled to an OR input of the first OAI gate and to an OR input of the third OAI gate. The third OR-AND-Invert gate has an output coupled to an OR input of the first OAI gate and to an OR input of the second OAI gate.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

DETAILED DESCRIPTION

Reference will now be made in detail to various embodiments of the present invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Three State Latch

It is to be appreciated that the term "three state" as used herein does not refer to, and is not analogous to the term "Tri-state®," a registered trademark of Texas Instruments, Inc., of Dallas, Tex. As is known to those of skill in the art, a Tri-state® device includes conventional "high" and "low" outputs, as well as a high impedance, or "hi-Z," output state. Embodiments in accordance with the present invention store three (or more) states in a single latch.

Figures 1A, 1B:
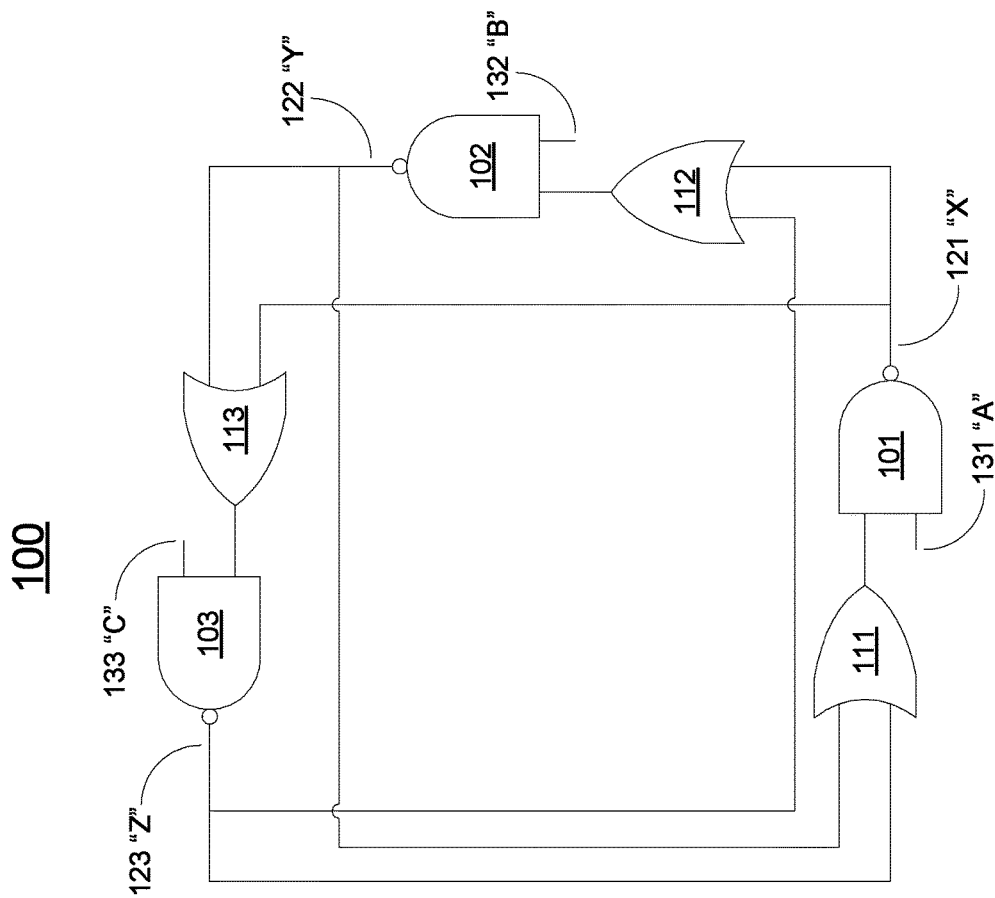
FIG. 1A illustrates an exemplary three state latch, in accordance with embodiments of the present invention.
FIG. 1B illustrates an exemplary truth table for a three state latch, in accordance with embodiments of the present invention.

FIG. 1A illustrates an exemplary three state latch 100, in accordance with embodiments of the present invention. Three state latch 100 comprises three inputs, 131 A, 132 B and 133 C, and three outputs, 121 X, 122 Y and 123 Z. Three state latch 100 comprises three two-input NAND gates 101, 102 and 103, and three two-input OR gates, 111, 112 and 113.

FIG. 1B illustrates an exemplary truth table 150 for three state latch 100 of FIG. 1A, in accordance with embodiments of the present invention. Setting input 131 A, 132 B or 133 C to zero forces the corresponding output 121 X, 122 Y or 123 Z to one. For example, setting input 133 C to zero forces output 123 Z to one. Similarly, setting an input to one forces the corresponding output to zero if any other input is zero.

If all inputs 131 A, 132 B and 133 C are set to one, then the output of latch 100 will retain the state it had last, as indicated by the last row of truth table 150. The "star" notation, e.g., "X*," indicates previous state of the output signal line. For example, if inputs 131 A and 132 B are set to one, and input 133 C is set to zero, outputs 121 X and 122 Y will be zero, and output 123 Z will be set to one. Changing input 133 C from zero to one will result in all inputs set to one, and the outputs will retain their previous state. In this example, outputs 121 X and 122 Y will be zero, and output 123 Z will be set to one. In accordance with embodiments of the present invention, which ever input is the last to transition from zero to one will have its output remain one.

It is appreciated that embodiments in accordance with the present invention offer several advantages in comparison to a three state circuit based on multiple conventional, e.g., two-state, latches. For example, there are no transitory states. In addition, embodiments in accordance with the present invention may operate asynchronously, e.g., with unclocked handshaking signals. Further, further, embodiments in accordance with the present invention generally require fewer gates, less die area and are thus less expensive in comparison to the conventional art. Still further, embodiments in accordance with the present invention will generally operate faster, e.g., with fewer gate delays, than under the conventional art. For example, in accordance with embodiments of the present invention, the worst case delay from input to output is two gate delays.

It is appreciated that three state latch 100 (FIG. 1) may be constructed from instances of an "OR-AND-INVERT" ("OAI") gate structure, which is logically (but not physically) equivalent to the illustrated pairs of cascaded gates. For example, symbolic gates 111 and 101 together represent an OR gate 111, followed by an AND gate followed by inversion, e.g., NAND gate 101. In accordance with embodiments of the present invention, a three state latch may be formed from an "AND-OR-INVERT" ("AOI") gate structure, with inversion of the truth table. Such embodiments are considered within the scope of the present invention.

Figure 1C:
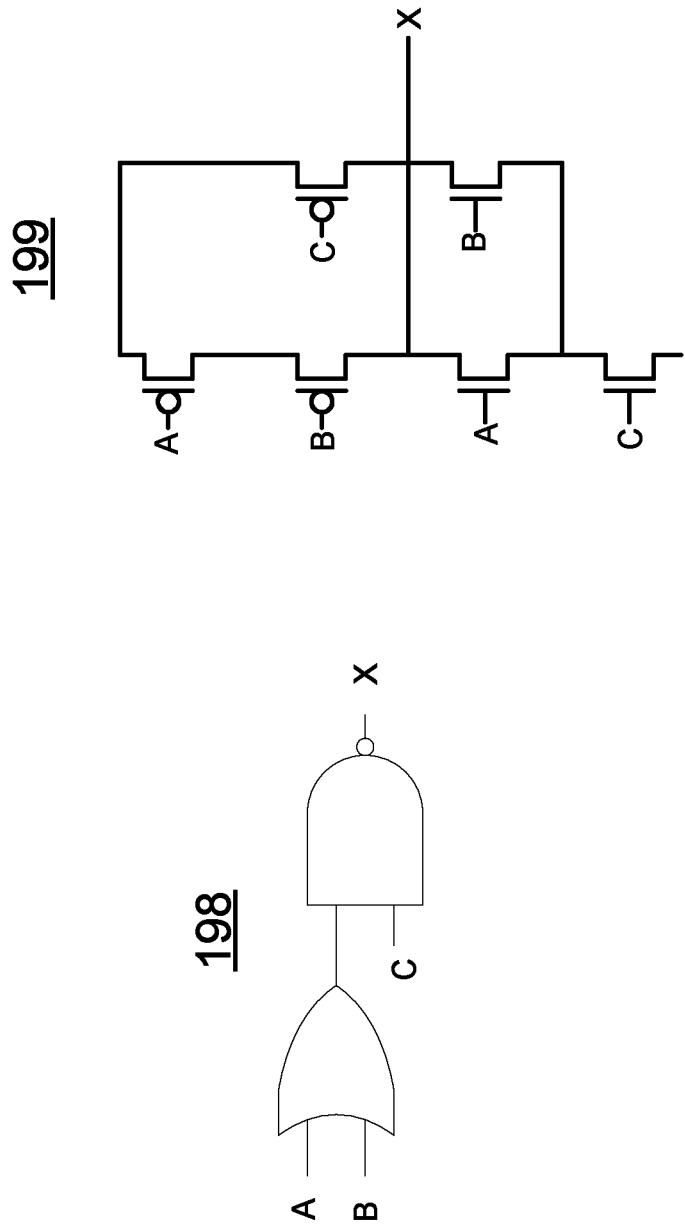
FIG. 1C illustrates a logical equivalence between a combination of OR and NAND gates and an OAI gate.

Latch 100 of FIG. 1A is presented schematically as a logical combination of OR and NAND gates. Each pair of OR and NAND gates may be rendered as a single OR-AND-Invert (OAI) gate with an equivalent logical function. FIG. 1C illustrates a logical equivalence between a combination of OR and NAND gates 198, e.g., as illustrated in FIG. 1A, and an OAI gate 199. While logically equivalent, e.g., gates 198 and gate 199 have the same truth table, it is appreciated that there are physical differences between two separate, cascaded gates as illustrated in 198 and a single OAI gate 199. For example, OAI gate 199 will generally comprise fewer transistors, less die area, and operate faster and at less power consumption, in comparison to the 198 structure. For example, OAI gate 199 produces an output in a single gate delay, whereas gates 198 may generally be expected to require two gate delays to propagate a signal.

Accordingly, embodiments in accordance with the present invention may utilize an OAI gate structure, e.g., OAI gate 199, or an AOI gate structure. However, the schematic representations presented herein illustrate the logical function of the separate gates. For example, all inputs of OAI gate 199 do not have the same logical function, and hence schematics utilizing the logical function of the separate gates represent a preferred approach to illustrate aspects of the present invention. With reference to FIG. 1C, inputs A and B are referred to as OR inputs of the OAI gate 199, and its schematic equivalent 198. Input C is referred to as a NAND input.

In addition, in accordance with embodiments of the present invention, latches with an arbitrary number of inputs may be formed by "widening" the first part of the gate, e.g., the OR gate in the exemplary OAI gate structure. For example, to form a four-input latch, the OR gates of FIG. 1A should be changed to be three input gates.

Figures 2A, 2B:
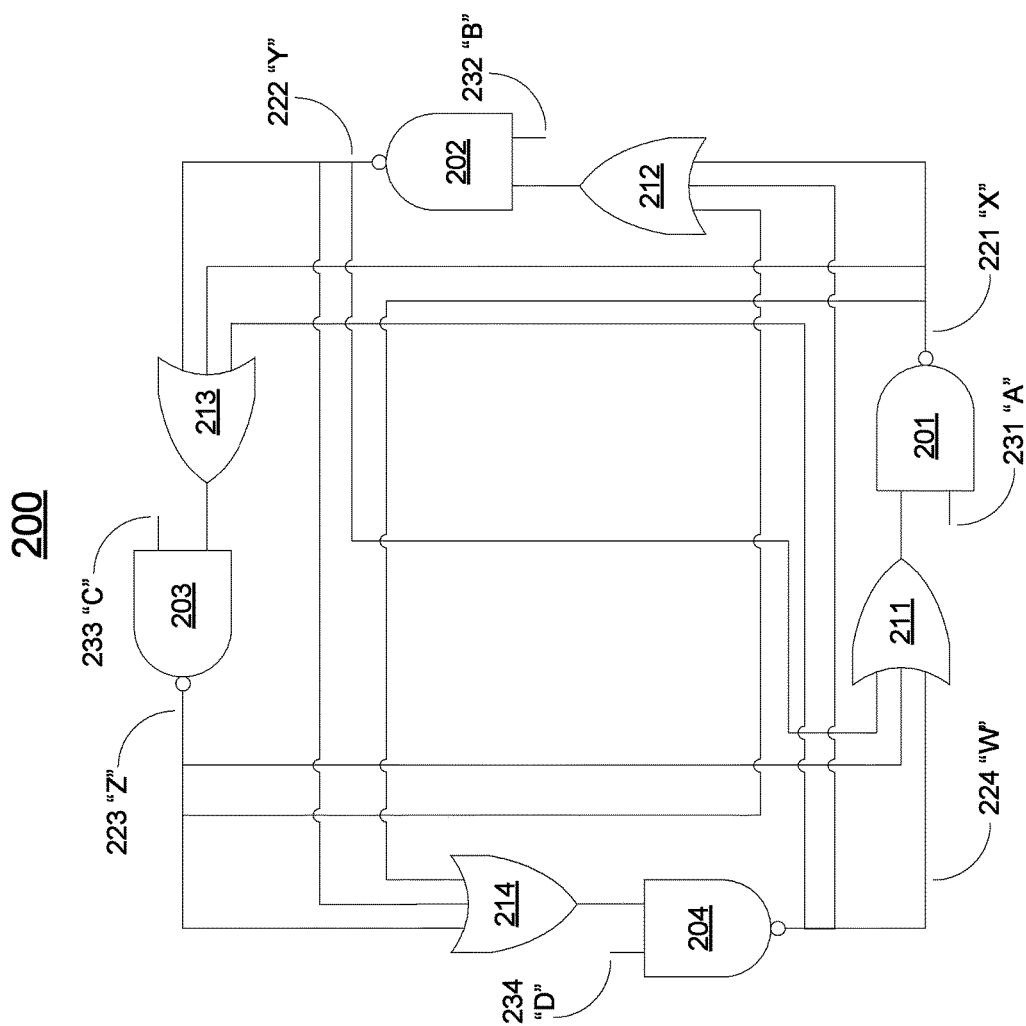
FIG. 2A illustrates an exemplary four state latch, in accordance with embodiments of the present invention.
FIG. 2B illustrates an exemplary truth table for a four state latch, in accordance with embodiments of the present invention.

FIG. 2A illustrates an exemplary four state latch 200, in accordance with embodiments of the present invention. Four state latch 200 comprises four inputs, 231 A, 232 B, 233 C and 234 D, and four outputs, 221 X, 222 Y, 223 Z and 224 W. Four state latch 200 comprises four two-input NAND gates 201, 202, 203 and 204, and four three-input OR gates, 211, 212, 213 and 214.

FIG. 2B illustrates an exemplary truth table 250 for four state latch 200 of FIG. 2A, in accordance with embodiments of the present invention. Setting input 231 A, 232 B, 233 C or 234 D to zero forces the corresponding output 221 X, 222 Y, 223 Z or 224 W to one. For example, setting input 233 C to zero forces output 223 Z to one.

If all inputs 231 A, 232 B, 233 C and 234 D are set to one, then the output of latch 200 will retain the state it had last, as indicated by the last row of truth table 250. The "star" notation, e.g., "X*," indicates previous state of the output signal line. For example, if inputs 231 A, 232 B, and 233 C are set to one, and input 234 D is set to zero, outputs 221 X, 222 Y and 223 Z will be zero, and output 224 W will be set to one. Changing input 234 D from zero to one will result in all inputs set to one, and the outputs will retain their previous state. In this example, outputs 221 X, 222 Y and 223 Z will be zero, and output 224 W will be set to one. In accordance with embodiments of the present invention, which ever input is the last to transition from zero to one will have its output remain one.

As illustrated in three state latch 100 of FIG. 1A and four state latch 200 of FIG. 2A, all outputs are cross coupled to logic accepting the other inputs. For example, with respect to four state latch 200 of FIG. 2A, output 221 X is coupled to OR gate 212, a part of the logic accepting input 232 B, is coupled to OR gate 213, a part of the logic accepting input 233 C, and is coupled to OR gate 214, a part of the logic accepting input 234 D. Accordingly, the first gate of each stage should have inputs for the number of states (stages) minus one.

Embodiments in accordance with the present invention provide systems and methods for three state latches. In addition, embodiments in accordance with the present invention provide systems and methods for three state latches that store more than two states in a single latch circuit. Further, embodiments in accordance with the present invention provide systems and methods for three state latches that store more than two states in a single latch circuit in a deterministic manner. Still further, embodiments in accordance with the present invention provide systems and methods for three state latches that store more than two states in a single latch circuit that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the below claims.

What is claimed is:

1. An electronic circuit comprising:
   n pairs of cascaded logical gates, wherein each of said pairs of cascaded logical gates comprises:
   a first logical gate comprising n−1 first gate inputs and a first gate output;
   a second logical gate comprising two second gate inputs and a second gate output,
   wherein one of said second gate inputs is coupled to said first gate output;
   wherein said second gate output is cross coupled to one of said first gate inputs of all other said pairs of cascaded logical gates; and
   where n is greater than 2.

2. The electronic circuit of claim 1 wherein said first and said second logical gates are rendered as a single OR-AND-INVERT gate.

3. The electronic circuit of claim 1 wherein said first logical gate comprises an OR gate.

4. The electronic circuit of claim 1 wherein said second logical gate comprises a NAND gate.

5. The electronic circuit of claim 1 wherein said first and said second logical gates comprise an AND-OR-INVERT gate structure.

6. The electronic circuit of claim 1 wherein said first logical gate comprises an AND gate.

7. The electronic circuit of claim 1 wherein said first logical gate comprises an NOR gate.

8. An electronic circuit comprising:
   a single latch circuit comprising:
   a first OR-AND-Invert (OAI) gate having an output coupled to an OR input of a second OAI gate and to an OR input of a third OAI gate;
   said second OR-AND-Invert (OAI) gate having an output coupled to an OR input of said first OAI gate and to an OR input of said third OAI gate; and
   said third OR-AND-Invert (OAI) gate having an output coupled to an OR input of said first OAI gate and to an OR input of said second OAI gate.

9. The electronic circuit of claim 8 wherein the output of said first, second and third OAI gates indicates a state of said single latch circuit.

10. The electronic circuit of claim 8 wherein each of said OAI gates output is configured to react to a change in said circuit inputs within a maximum of two gate delays.

11. The electronic circuit of claim 8 configured so that a zero on a NAND input of one of said OAI gates generates a one on the output of said one of said OAI gates.

12. The electronic circuit of claim 8 configured so that one on less than all NAND input of said first, second and third OAI gates forces a one on the output of the corresponding OAI gate.

13. The electronic circuit of claim 8 configured so that when all said NAND inputs of said single latch circuit are set to one, a previous state of the latch is retained.

14. An electronic circuit comprising:
   a single latch circuit comprising:
   n OR-AND-Invert (OAI) gates,
   wherein an output of each said OAI gate is coupled to an input of n−1 other said OAI gates; and
   where n is greater than 2.

15. The electronic circuit of claim 14 wherein each of said OAI gates is configured to change its output responsive to a change at an input within a maximum of two gate delays.

16. The electronic circuit of claim 14 wherein said single latch circuit is configured to operate without a clock signal.

17. The electronic circuit of claim 14 wherein said single latch circuit has no transitory states.

18. The electronic circuit of claim 14 wherein said single latch circuit comprises $2_n-1$ stable states.

19. The electronic circuit of claim 14 wherein a zero on an input forces a corresponding output to one.

20. The electronic circuit of claim 14 wherein said single latch circuit comprises a maximum of 6n transistors.

21. An electronic circuit comprising:
   n pairs of cascaded gates, wherein each of said pairs of cascaded gates comprises:
   a first gate comprising n−1 first gate inputs and a first gate output;
   a second gate comprising two second gate inputs and a second gate output,
   wherein one of said second gate inputs is coupled to said first gate output;
   wherein said second gate output is coupled to one of said first gate inputs of n−1 other said pairs of cascaded gates; and
   where n is greater than 2.

22. The electronic circuit of claim 21 wherein said first and said second logical gates are rendered by not more than 6 transistors in total.

* * * * *